(12) United States Patent
Zhang et al.

(10) Patent No.: US 7,863,931 B1
(45) Date of Patent: Jan. 4, 2011

(54) FLEXIBLE DELAY CELL ARCHITECTURE

(75) Inventors: Fulong Zhang, Allentown, PA (US);
Zhen Chen, Allentown, PA (US);
William Andrews, Macungie, PA (US);
Barry Britton, Allentown, PA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 411 days.

(21) Appl. No.: 11/939,787

(22) Filed: Nov. 14, 2007

(51) Int. Cl.
*H03K 19/177* (2006.01)
*H03K 19/00* (2006.01)

(52) U.S. Cl. .............................. 326/40; 326/93; 326/38

(58) Field of Classification Search ............. 326/37–41, 326/46, 47, 93; 327/261–288
See application file for complete search history.

(56) References Cited

U.S. PATENT DOCUMENTS

| | | | | |
|---|---|---|---|---|
| 4,231,104 A * | 10/1980 | St. Clair | ...................... | 713/500 |
| 4,756,011 A * | 7/1988 | Cordell | ........................ | 375/371 |
| 4,773,085 A * | 9/1988 | Cordell | ........................ | 375/375 |
| 4,821,296 A * | 4/1989 | Cordell | ........................ | 375/374 |
| 5,081,655 A * | 1/1992 | Long | ........................... | 375/373 |
| 5,134,636 A * | 7/1992 | Barucchi et al. | ............. | 375/354 |
| 5,278,873 A * | 1/1994 | Lowrey et al. | .............. | 375/371 |
| 5,550,860 A * | 8/1996 | Georgiou et al. | ............ | 375/220 |
| 5,778,214 A * | 7/1998 | Taya et al. | ................... | 713/400 |
| 5,923,197 A * | 7/1999 | Arkin | .......................... | 327/262 |
| 6,002,282 A * | 12/1999 | Alfke | .......................... | 327/165 |
| 6,023,133 A * | 2/2000 | Leung et al. | ........... | 315/368.21 |
| 6,025,745 A * | 2/2000 | Lee et al. | ...................... | 327/277 |
| 6,058,057 A * | 5/2000 | Ochiai et al. | ................. | 365/201 |
| 6,150,863 A * | 11/2000 | Conn et al. | ................... | 327/270 |
| 6,157,690 A * | 12/2000 | Yoneda | ......................... | 375/376 |
| 6,504,408 B1 * | 1/2003 | von Kaenel | ................. | 327/158 |
| 6,590,434 B2 * | 7/2003 | Chung et al. | ................. | 327/277 |
| 6,628,154 B2 * | 9/2003 | Fiscus | ......................... | 327/158 |
| 6,765,973 B1 * | 7/2004 | Miller et al. | ................. | 375/354 |
| 6,771,134 B2 * | 8/2004 | Wong et al. | .................... | 331/57 |
| 6,867,630 B1 * | 3/2005 | Talledo et al. | ............... | 327/284 |
| 6,980,042 B2 * | 12/2005 | LaBerge | ...................... | 327/291 |
| 7,009,433 B2 * | 3/2006 | Zhang et al. | ................. | 327/158 |
| 7,034,596 B2 * | 4/2006 | Andrews et al. | ............ | 327/257 |
| 7,109,756 B1 | 9/2006 | Zhang | | |

(Continued)

OTHER PUBLICATIONS

John F. Snow, Xilinx, Efficient 8X Oversampling Asynchronous Serial Data Recovery Using IDELAY, Jul. 20, 2007, 11 pages.

*Primary Examiner*—James H. Cho
*Assistant Examiner*—Matthew C Tabler
(74) *Attorney, Agent, or Firm*—Haynes and Boone, LLP

(57) ABSTRACT

A flexible delay cell architecture and related methods are provided that may be used, for example, with input/output (I/O) blocks of a programmable logic device (PLD). In one implementation, a PLD includes a delay cell comprising a plurality of delay elements. The delay elements are adapted to delay an input signal to provide an output signal according to a delay setting corresponding to a number of the delay elements. The PLD also includes a register adapted to store the delay setting. The PLD further includes an edge monitor adapted to signal whether an edge transition of the output signal has occurred during a time window. In addition, the PLD includes logic adapted to adjust the delay setting stored by the register in response to the edge monitor signaling the edge transition.

5 Claims, 13 Drawing Sheets

U.S. PATENT DOCUMENTS

| | | |
|---|---|---|
| 7,109,758 B2 * | 9/2006 | Lin .............................. 326/112 |
| 2006/0033544 A1 * | 2/2006 | Hui et al. .................... 327/276 |
| 2006/0164141 A1 * | 7/2006 | Self ........................... 327/158 |
| 2007/0109880 A1 * | 5/2007 | Zhang et al. ................ 365/194 |

* cited by examiner

FLEXIBLE DELAY CELL ARCHITECTURE

TECHNICAL FIELD

The present invention relates generally to input/output circuitry and, more particularly, to delay cells used with input/output circuitry.

BACKGROUND

For many devices, such as field-programmable gate arrays (FPGAs) or other types of programmable logic devices (PLDs), accurate timing of input/output (I/O) interfaces is important to maintaining performance. However, as I/O interface data rates increase, the timing relationships between clock signals and data signals can become difficult to manage. For example, source-synchronized I/O interfaces may require clock or/or data signals to be delayed relative to each other for received or transmitted signals.

For received signals in particular, it can be difficult to maintain accurate timing at extremely high speeds due to the shrinking size of valid data windows and their drift caused by voltage or temperature changes. As a result, the use of fixed delay elements or fixed phase delays determined by clock cycle percentages can be insufficient to maintain accurate timing of high speed signals received by PLDs. For example, the adjustment of programmed delay amounts by low speed PLD logic can incur data loss when delay amounts are changed while high speed received data signals are transitioning between data values. In addition, duty cycle distortion can become a significantly larger portion of valid data windows as the size of the valid data windows shrink.

Also, for high speed serial communications, it is often preferable for data and clock signals to be recovered from a single high speed serial link within short lock times, such as on the order of tens of bits. This can be problematic for existing I/O interfaces designed to perform clock data recovery over longer lock times of hundreds or even one thousand bits.

Another approach to recovering data and clock signals from serial links to PLDs involves dedicated hardware to capture data using multiple clock phases (for example, 8 phases). However, such implementations are complicated by the chip area consumed by such dedicated hardware and the resynchronization of captured data into a common clock domain.

Accordingly, there is a need for an improved approach to reducing these various problems associated with the timing of high speed signals. In particular, there is a need to facilitate accurate timing of signals linked to PLDs and other device types.

SUMMARY

In accordance with one embodiment of the present invention, a programmable logic device (PLD) includes a delay cell comprising a plurality of delay elements adapted to delay an input signal to provide an output signal according to a delay setting corresponding to a number of the delay elements; a register adapted to store the delay setting; an edge monitor adapted to signal whether an edge transition of the output signal has occurred during a time window; and logic adapted to adjust the delay setting stored by the register in response to the edge monitor signaling the edge transition.

In accordance with another embodiment of the present invention, a method includes applying an input signal to a delay cell having an adjustable delay setting; delaying the input signal through the delay cell in accordance with a delay setting to provide an output signal; detecting whether an edge transition of the output signal has occurred during a time window; and adjusting the delay setting in response to the detecting of the edge transition.

In accordance with another embodiment of the present invention, a programmable logic device (PLD) includes means for receiving a serial data signal; means for delaying the serial data signal to provide a first plurality of output signals, wherein the first plurality of output signals are delayed relative to the serial data signal by a first plurality of delay times distributed over a first portion of a bit period of the serial data signal; means for delaying the serial data signal to provide a second plurality of output signals, wherein the second plurality of output signals are delayed relative to the serial data signal by a second plurality of delay times distributed over a second portion of the bit period of the serial data signal; means for detecting whether edge transitions of the first and second plurality of output signals have occurred during a plurality of time windows; and means for selecting one of the output signals in response to the detecting means.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

As set forth in various embodiments described herein, flexible delay cells are provided that may be used to manage input clock or data delay, output clock or data delay, and additionally, as clock tree delay management. For example, various delay cell implementations described herein may be used in input/output blocks of devices, such as programmable logic devices (PLDs).

In one embodiment, a delay cell may be implemented with a one-shot feature to permit adjustment of programmed delay times using a high speed clock that is also used to sample incoming data. Such an implementation permits continuous operation of the delay cell during adjustment without incurring data loss.

In another embodiment, a delay cell includes a duty cycle tuning and waveform manipulation feature that may be used to adjust the duty cycle of received signals or transmitted signals. This feature may be used, for example, to correct distorted signals, or to center rising and falling edge clocks independently (for example, in double data rate (DDR) applications).

In another embodiment, a delay cell includes an edge monitor feature to monitor data windows of received data signals on a cycle-to-cycle basis without interrupting ongoing data traffic. PLD logic may be used to adjust programmed delay times of the delay cell to move data sample points away from data transition edges of the data windows.

In another embodiment, delay cells may be used as part of systems to perform high or low speed serial data recovery. Such systems may be implemented to sample serial data bit periods multiple times in order to determine data values associated with the bit periods. For example, in high speed serial data recovery applications, a plurality of data cells may be used to sample at various points over a serial data bit period. In another example, in low speed serial data recovery applications, a plurality of data cells may be used to oversample serial data in order to obtain samples of various points over a serial data bit period.

Figure 1:
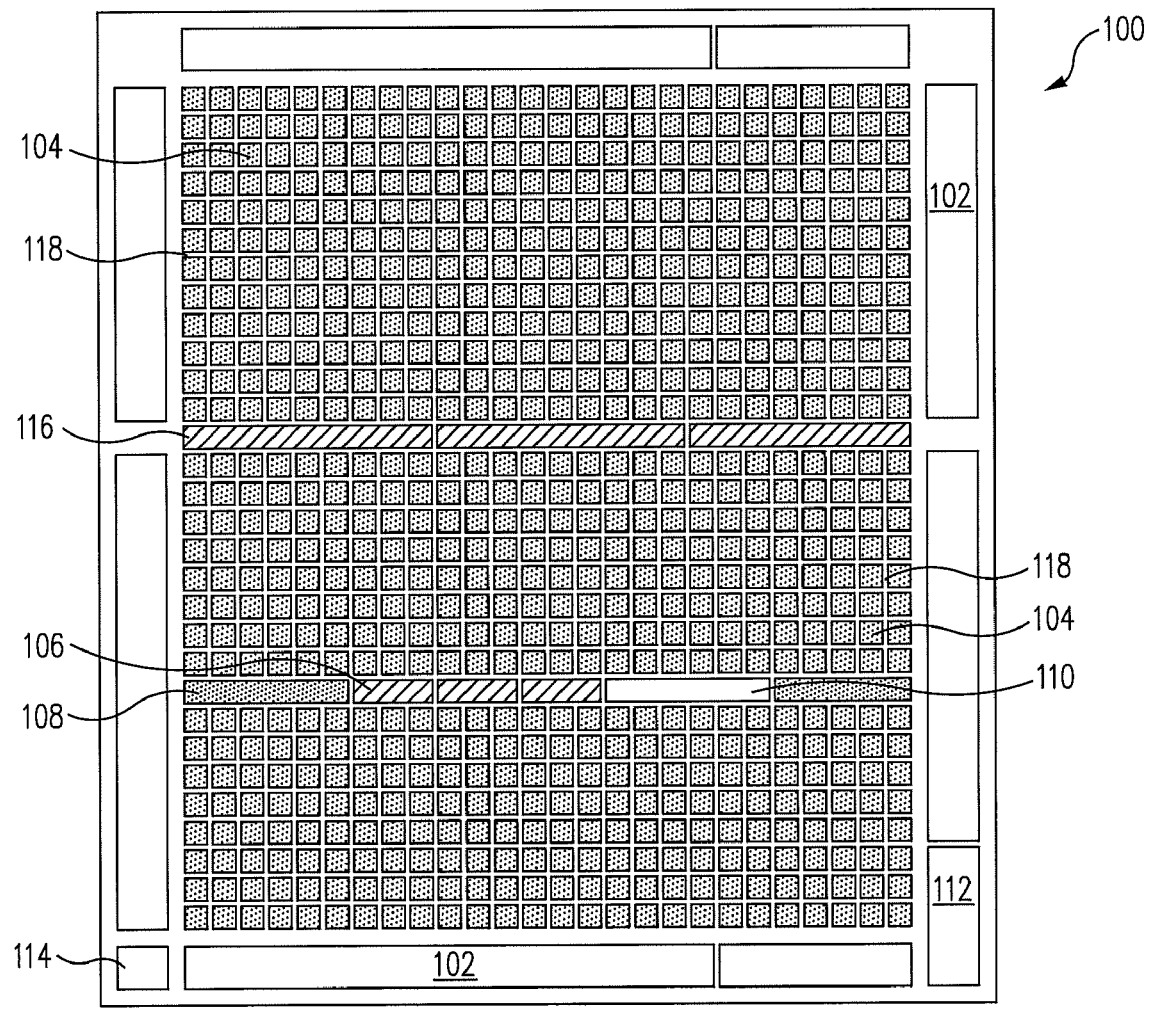
FIG. 1 illustrates a block diagram of a programmable logic device (PLD) in accordance with an embodiment of the invention.

FIG. 1 illustrates a block diagram of a programmable logic device (PLD) 100 in accordance with an embodiment of the invention. PLD 100 (e.g., a field programmable gate array (FPGA), a complex programmable logic device (CPLD), a field programmable system on a chip (FPSC), or other type of programmable device) generally includes input/output (I/O) blocks 102 and logic blocks 104 (e.g., also referred to as programmable logic blocks (PLBs), programmable functional units (PFUs), or programmable logic cells (PLCs)). I/O blocks 102 provide I/O functionality (e.g., to support one or more I/O and/or memory interface standards) for PLD 100, while programmable logic blocks 104 provide logic functionality (e.g., LUT-based logic or logic gate array-based logic) for PLD 100.

PLD 100 may also include blocks of memory 106 (e.g., blocks of EEPROM, block SRAM, and/or flash memory), clock-related circuitry 108 (e.g., PLL and/or DLL circuits), configuration logic 110 (e.g., for startup, decryption, encryption, multiple-boot support (e.g., dual boot support), and/or error detection), a configuration port 112, configuration memory 114, special function blocks 116 (e.g., digital signal processing (DSP) blocks or other forms of multiply and accumulate circuit functionality), and/or routing resources 118. In general, the various elements of PLD 100 may be used to perform their intended functions for the desired application, as would be understood by one skilled in the art.

For example, configuration port 112 may be used for programming PLD 100, such as memory 106 and/or configuration memory 114 or transferring information (e.g., various types of data and/or control signals) to/from PLD 100 as would be understood by one skilled in the art. For example, configuration port 112 may include a first programming port (which may represent a central processing unit (CPU) port, a peripheral data port, a serial peripheral interface, and/or a sysCONFIG programming port) and/or a second programming port such as a joint test action group (JTAG) port (e.g., by employing standards such as Institute of Electrical and Electronics Engineers (IEEE) 1149.1 or 1532 standards). Configuration port 112 typically, for example, may be included to receive configuration data and commands to support serial or parallel device configuration and information transfer.

It should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, are not limiting and may depend upon the desired application. For example, special function blocks 116 are optional and various other elements may not be required for a desired application or design specification (e.g., for the type of programmable device selected).

Furthermore, it should be understood that the elements are illustrated in block form for clarity and that certain elements, such as for example configuration memory 114 or routing resources 118, would typically be distributed throughout PLD 100, such as in and between logic blocks 104, to perform their conventional functions (e.g., storing configuration data that configures PLD 100 or providing interconnect structure within PLD 100, respectively). It should also be understood that the various embodiments of the present invention as disclosed herein are not limited to programmable logic devices, such as PLD 100, and may be applied to various other types of programmable devices, as would be understood by one skilled in the art.

Figure 2:
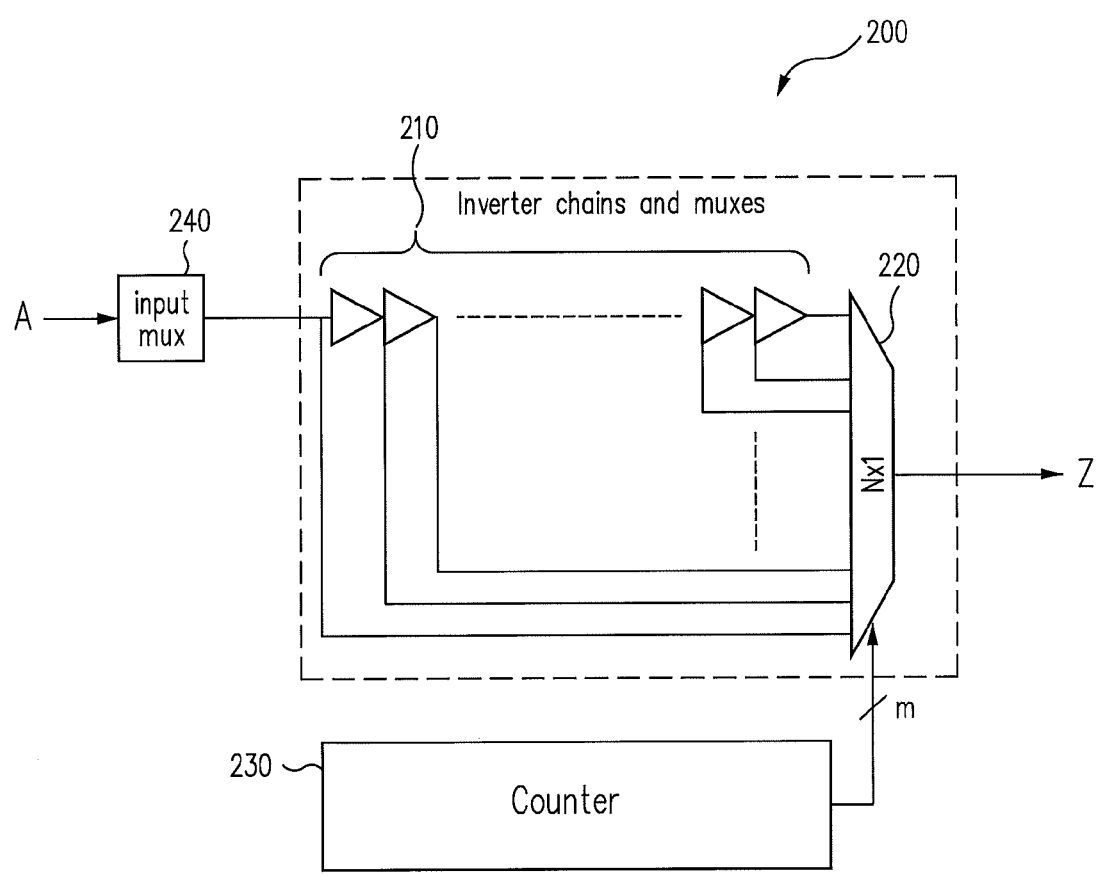
FIG. 2 illustrates a block diagram of a delay cell in accordance with an embodiment of the invention.

FIG. 2 illustrates a block diagram of a delay cell 200 in accordance with an embodiment of the invention. Delay cell 200 may be implemented, for example, as part of I/O blocks 102 of PLD 100 illustrated in FIG. 1. Means such as I/O blocks 102 may be used for receiving input signals such as serial data signals which are provided to multiplexer 240 and selectively provided to delay cell 200. As shown in FIG. 2, an input signal A may be delayed by delay cell 200 to provide an output signal Z.

Delay cell 200 includes a plurality of delay elements 210 that feed a multiplexer 220. In one embodiment, delay elements 210 may be implemented as N inverters in the manner illustrated in FIG. 2. In other embodiments, delay elements 210 may be implemented using voltage controlled delay elements, current controlled delay elements, or other appropriate types of delay elements.

Multiplexer 220 is controlled by a counter 230 (e.g., implemented in the illustrated embodiment as an m-bit register) which may be used to select the number of delay elements currently used by delay cell 200 by controlling multiplexer 220. In this regard, counter 230 may be programmed to select a desired number of delay elements 210 corresponding to a desired delay time to be implemented by delay cell 200. In various embodiments, multiplexer 220 and/or counter 230 may be provided separately from delay cell 200 (e.g., as illustrated in FIG. 2) or implemented as part of delay cell 200. In one embodiment, multiplexer 220 may be implemented as a multi-stage multiplexer with a bypass path.

Figure 3:
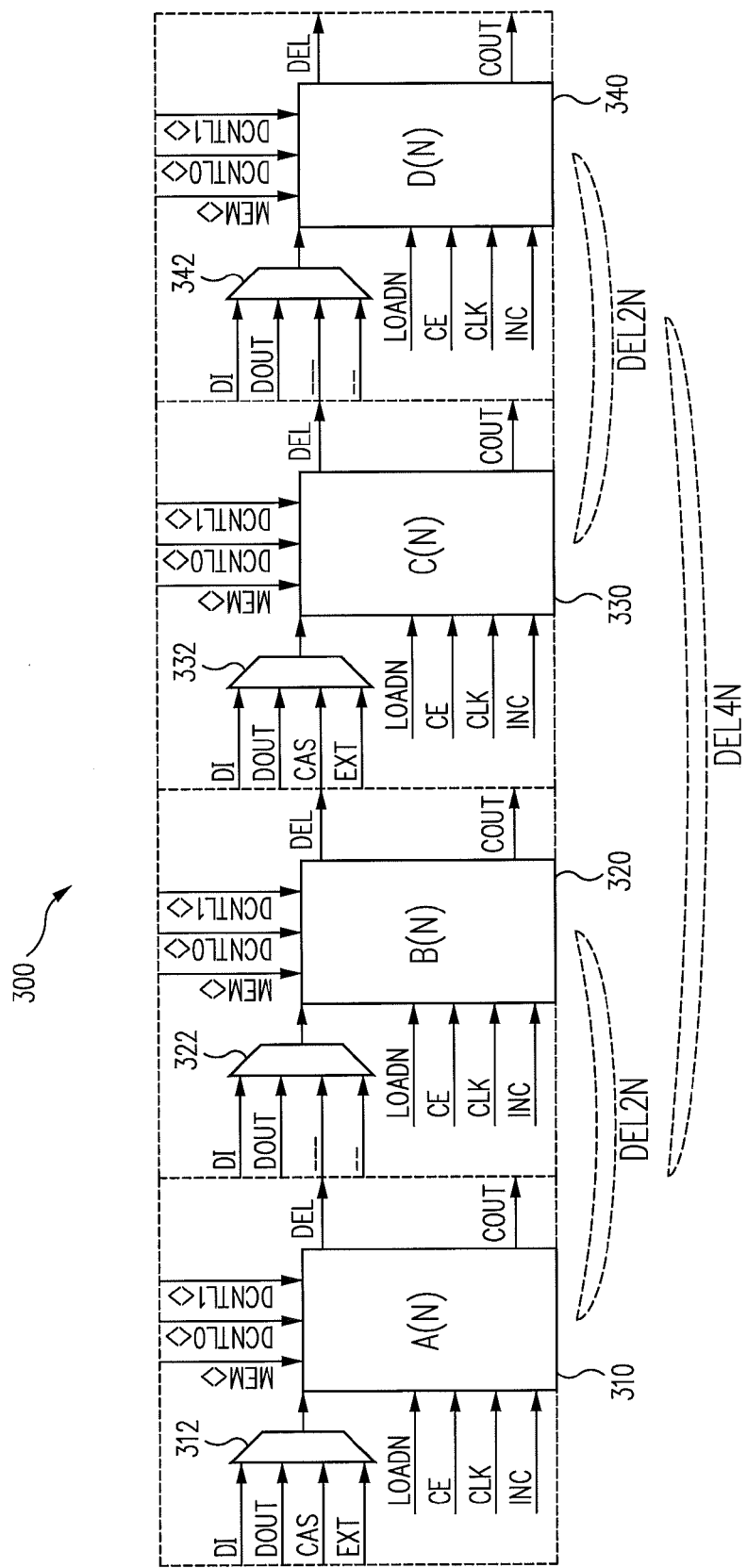
FIG. 3 illustrates a block diagram of a plurality of delay cells that may be used together in accordance with an embodiment of the invention.

FIG. 3 illustrates a block diagram of a plurality of delay cells 300 that may be used together in accordance with an embodiment of the invention. In particular, delay cells 300 include individual delay cells 310, 320, 330, and 340 (labeled A(N), B(N), C(N), and D(N), respectively), each of which may be implemented, for example, by any of the various delay cells disclosed herein.

Delay cells 300 may be initially programmed with desired delay settings provided by various programming signals (labeled MEM, DCNTL0, and DCNTL1). These programming signals may be loaded into registers of delay cells 300 (for example, implemented by counter 230 of FIG. 2) in response to a load signal (for example, an asynchronous signal LOADN). In one embodiment, the programming signals and load signal may be provided by memory, control busses, or general routing buses of a PLD.

Multiplexers 312, 322, 332, and 342 receive various input signals (labeled DI, DOUT, CAS, and EXT) that may be selectively provided to delay cells 300 which delay the input signals to provide output signals (labeled DEL). For example, in one embodiment, signal DI may be an external signal received by a PLD, signal DOUT may be received from PLD logic (e.g., programmable logic blocks 104 of PLD 100), signal CAS may be a cascaded delay signal received from another delay cell, and signal EXT may be a segmented edge clock. The use of other appropriate signals is also contemplated.

Delay cells 300 receive various delay adjustment signals (labeled CE and INC) from, for example, PLD logic. In this regard, after delay cells 300 have been programmed with initial desired delay settings provided by programming signals, the delay settings of delay cells 300 may be incrementally adjusted up or down in response to the delay adjustment signals.

In addition, delay cells 300 receive a clock signal CLK. For example, in one embodiment, clock signal CLK may be a high speed clock signal associated with one or more of the input signals to provide synchronization. Signal INC may be used to identify whether the delay setting is to be incremented (e.g., if INC corresponds to a logic high value) or decremented (e.g., if INC corresponds to a logic low value). In one embodiment, signals CE and INC may be asynchronous signals that operate at frequencies lower than the frequency of clock signal CLK.

Signal CE may be used to trigger an optional one shot feature of delay cells 300. In this regard, each time signal CE transitions from a logic low value to a logic high value, registers of delay cells 300 (e.g., provided by counters 230 storing the currently programmed delay settings of delay cells 300) will increase or decrease by only one value, regardless of how many clock signal transitions are provided by signal CLK while signal CE remains set to a logic high value. Each of delay cells 300 may also provide an overflow signal (labeled COUT) to indicate when their respective counters reach an overflow condition (e.g., reaching a maximum value when counting up or reaching zero when counting down).

As a result, the delay settings of delay cells 300 may be adjusted in response to low speed delay adjustment signals (e.g., signals CE and INC) while delay cells 300 continue to delay high speed input signals (e.g., signals DI, DOUT, CAS, and EXT) synchronized by a high speed clock signal (e.g., signal CLK) without loss of data. Advantageously, by using this one shot feature, low speed signals CE and INC need not be implemented to guarantee a setup hold time within a short period of high speed clock signal CLK.

The maximum frequency of high speed input clock signal CLK that may be used is implementation-dependent. For example, in one embodiment, the maximum frequency of high speed input clock signal CLK is determined by a total delay time corresponding to the sum of: clock-to-output delays occurring when counter 230 is adjusted up or down; propagation time for the changed value of counter 230 to pass through delay elements 890 and associated multiplexers to arrive at flip flops 830 (see FIG. 8 further described herein); and setup times of flip flops 830. In this embodiment, for double data rate (DDR) data traffic, the total delay time cannot exceed one half clock cycle period. For single data rate (SDR) data traffic in this embodiment, the total delay time cannot one clock cycle period.

Each of delay cells 300 may be implemented to include any desired number of delay elements therein(for example, N delay elements). As illustrated in FIG. 3, delay cells 300 may also be cascaded together as desired to provide larger delay settings using their collective number of delay elements (for example, 2N or 4N delay elements).

For example, individual delay cells 310 and 320 may be cascaded together to provide a delay cell chain labeled DEL2N with their respective number of delay elements programmed by the counter of delay cell 310. Delay cells 330 and 340 can be similarly configured into a delay cell chain as well. In another example, individual delay cells 310, 320, 330, and 340 may be cascaded together to provide a delay cell chain labeled DEL4N with delay cells 310/320 being controlled by the counter of delay cell 310, and delay cells 330/340 being controlled by the counter of delay cell 330.

Figure 4:
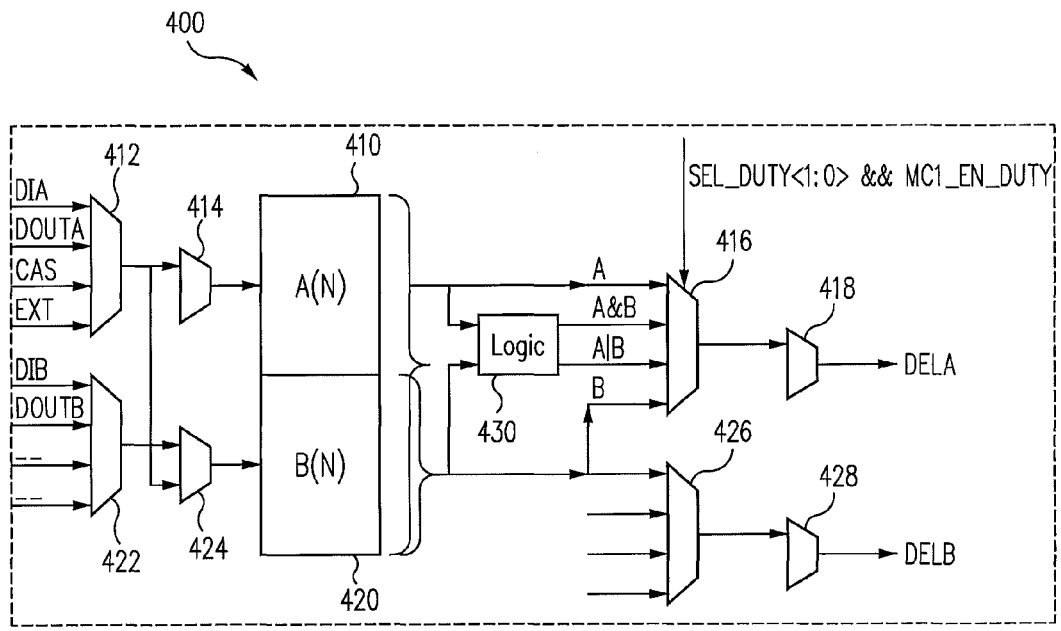
FIG. 4 illustrates a block diagram of a plurality of delay cells implemented to provide an adjustable duty cycle in accordance with an embodiment of the invention.

FIG. 4 illustrates a block diagram of a plurality of delay cells 400 implemented to provide an adjustable duty cycle in accordance with an embodiment of the invention. In particular, delay cells 400 include individual delay cells 410 and 420 (labeled A(N) and B(N), respectively), each of which may be implemented, for example, by any of the various delay cells disclosed herein.

As shown in FIG. 4, various input signals received by multiplexers 412 and 422 may be selectively provided to delay cells 410 and 420 through additional multiplexers 414 and 424. Output signals A and B from delay cells 410 and 420 may be provided to multiplexers 416 and 426 and logic 430. In this regard, logic 430 may be implemented to perform various operations on the output signals. For example, in the embodiment illustrated in FIG. 4, logic 430 may be implemented to perform an AND operation on output signals A and B, and to further perform an OR operation on output signals A and B. As shown in FIG. 4, resulting signals provided by logic 430 are also provided to multiplexer 416. Multiplexers 416 and 426 can selectively provide various signals received from delay cells 410/420 and logic 430 to additional multiplexers 418 and 428 which provide signals DELA and DELB as shown.

By selectively programming delay cells 410 and 420 with various delay settings and performing logic operations on output signals A and B provided by delay cells 410 and 420, respectively, the duty cycle of signal DELA may be adjusted relative to the original input signals received by delay cells 410 and 420. As shown in FIG. 4, a two bit select signal may be provided (for example, provided by PLD logic) to multiplexer 416 to select any of signals A, B, A&B, or A|B.

Figure 5:
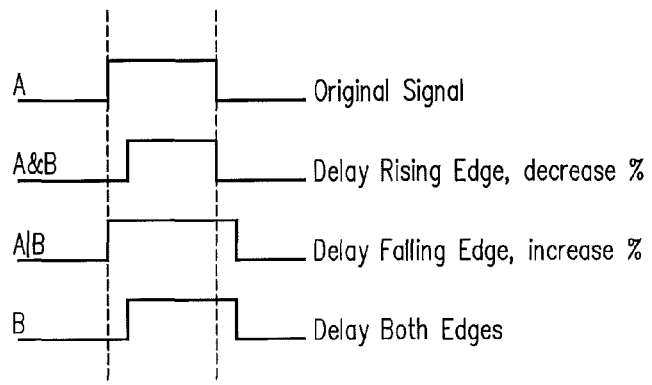
FIG. 5 illustrates a timing diagram showing signals provided by the delay cells of FIG. 4 in accordance with an embodiment of the invention.

FIG. 5 illustrates a timing diagram showing signals provided by delay cells 410 and 420 of FIG. 4 in accordance with an embodiment of the invention. In the embodiment shown in FIG. 5, delay cell 420 has been programmed with a delay setting longer than that of delay cell 410. As a result, the rising and falling edges of output signal B are delayed relative to the rising and falling edges of output signal A.

Signal A&B is provided by logic 430 in response to an AND operation performed on signals A and B. As shown, the rising edge of signal A&B is delayed with respect to signal A, and the falling edge of signal A&B corresponds to that of signal A. Accordingly, signal A&B provides a lower duty cycle (e.g., signal A&B exhibits a logic high value for a lower percentage of each period) than that of the original input signal (of which signal A is a delayed version).

Signal A|B is provided by logic 430 in response to an OR operation performed on signals A and B. As shown, the rising edge of signal A|B corresponds to that of signal A, and the falling edge of signal A|B is delayed with respect to that of signal A. Accordingly, signal A|B provides a higher duty cycle (e.g., signal A|B exhibits a logic high value for a higher percentage of each period) than that of the original input signal.

Logic 430 may be implemented to perform other logic operations (for example, XOR operations or other operations) on the output signals of delay cells 410 and 420 in order to provide signals exhibiting other duty cycles or other characteristics if desired.

Advantageously, by adjusting the duty cycle of output signals relative to input signals, delay cells 410 and 420 may be used to improve the performance of signals received or transmitted by a PLD. For example, in one embodiment, distorted portions of received clock signals may be removed by adjusting the rising or falling edges of such signals to provide a 50% duty cycle or other desired duty cycle. In another embodiment, the duty cycles of transmitted clock signals may be adjusted to provide a 50% duty cycle or other desired duty cycle. In another embodiment, clock signals may be tuned to improve data sampling by independently adjusting their rising and falling edges (for example, in System Packet Interface Level 4 (SPI4) implementations operating at speeds over 1 Gb/sec).

In one embodiment, delay cells 410 and 420 may be implemented by delay cells 310/320 or delay cells 330/340 of FIG. 3. In this regard, delay cells 310, 320, 330, and 340 may be configured in various ways to implement desired numbers of delay elements and/or adjust the duty cycles of delayed signals. The following Table 1 identifies several combinations of delay cells 310, 320, 330, and 340:

TABLE 1

| Combination | Delay cell 310 | Delay cell 320 | Delay cell 330 | Delay cell 340 |
|---|---|---|---|---|
| Single | DELN | DELN | DELN | DELN |
| Duty32 | DELN_DUTY | — | DELN_DUTY | — |
| DEL2N | DEL2N | — | DEL2N | — |
| Cascade A to C | DEL4N | — | — | — |
| Cascade C to A | — | — | DEL4N | — |
| Cascade A to C | DEL2NDUTY | — | — | — |
| Cascade C to A | — | — | DEL2NDUTY | — |

In a "single" combination referenced in Table 1, each of delay cells 310, 320, 330, and 340 may be used independently to delay separate signals using N delay elements each. In a "duty32" combination, delay cells 310/320 may be used together to adjust a duty cycle of a signal, and delay cells 330/340 may be used together to adjust a duty cycle of another signal. In a "DEL2N" combination, delay cells 310/320 may be used together to delay a signal using a combined total of 2N delay elements, and delay cells 330/340 may be used together to delay another signal using a combined total of 2N delay elements.

In a "Cascade A to C" combination, delay cells 310/320 may be used together and cascaded into delay cells 330/340 to delay a signal using a combined total of 4N of all of delay cells 300. Alternatively in the "Cascade A to C" combination, delay cells 310/320 may be used together to adjust a duty cycle of a signal.

In a "Cascade C to A" combination, delay cells 330/340 may be cascaded into delay cells 310/320 to delay a signal using a combined total of 4N of all of delay cells 300. Alternatively in the "Cascade C to A" combination, delay cells 330/340 may be used together to adjust a duty cycle of a signal.

Figure 6A:
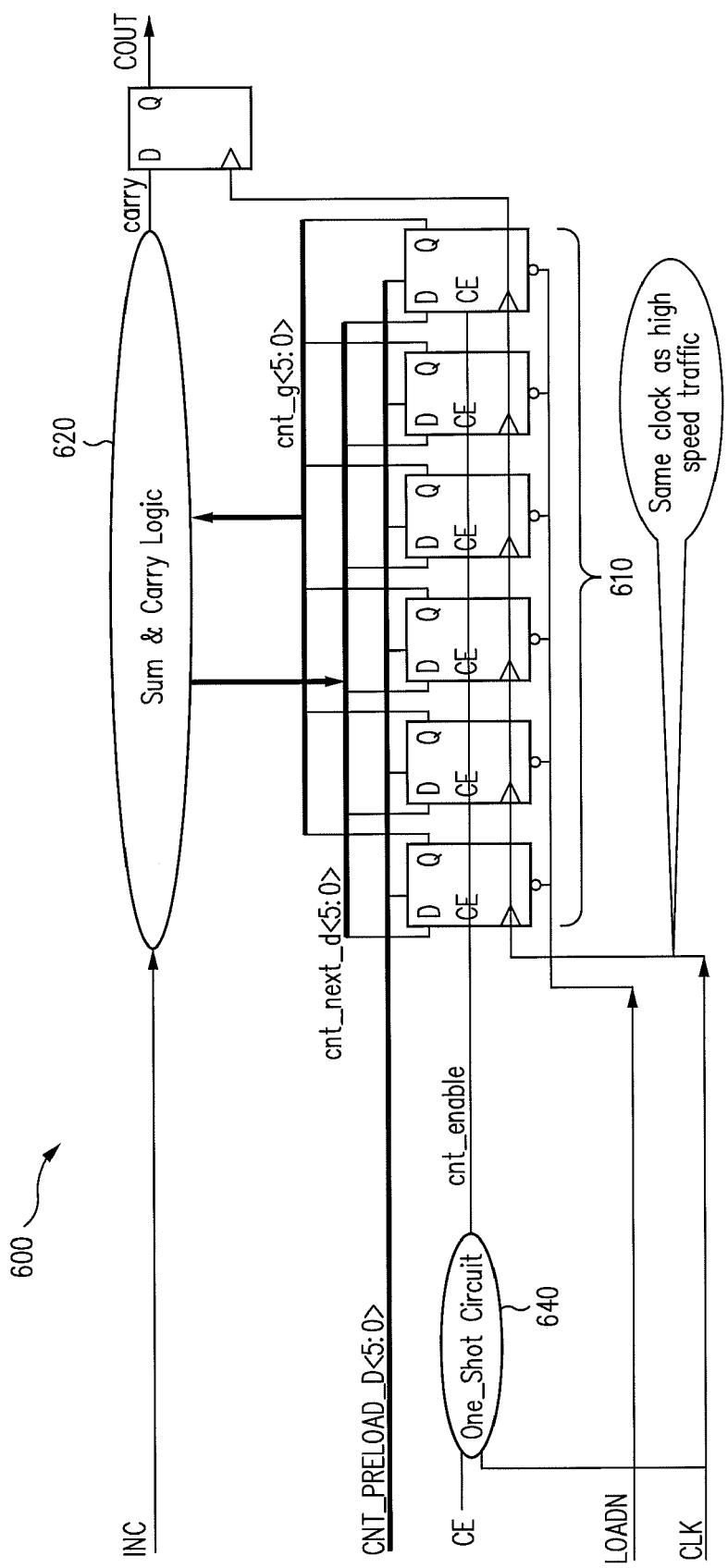
FIG. 6A illustrates a block diagram of a delay cell counter in accordance with an embodiment of the invention.

FIG. 6A illustrates a block diagram of a delay cell counter 600 in accordance with an embodiment of the invention. Counter 600 may be provided as part of any of the delay cells set forth in the present disclosure. For example, in one embodiment, counter 600 may be used to implement counter 230 of delay cell 200 illustrated in FIG. 2.

As shown in FIG. 6A, counter 600 (a register or equivalent storage) includes a plurality of registers 610, sum and carry logic 620, an overflow register 630, and a one shot circuit 640. Registers 610 may be implemented, for example, by flip flops used to store the currently programmed delay setting of a delay cell. In this regard, registers 610 may be initially programmed with a desired delay setting provided by one or more programming signals. In the embodiment illustrated in FIG. 6A, six registers 610 are used to store a six bit delay setting. Accordingly, a six bit programming signal CNT_PRELOAD_D is provided is shown. However, other programming signals may be used, such as programming signals MEM, DCNTL0, or DCNTL1 previously described in FIG. 3. The initial delay setting provided by the programming signals may be loaded into registers 610 in response to load signal LOADN.

Counter 600 receives delay adjustment signals CE and INC, and clock signal CLK previously described in FIG. 3. Accordingly, after registers 610 have been programmed with an initial delay setting provided by programming signals CNT_PRELOAD_D, the delay setting stored by registers 610 may be incrementally adjusted up or down in response to delay adjustment signals CE and INC.

The current delay setting stored by registers 610 is provided to sum and carry logic 620 by signal cnt_q. In addition, the next value to be stored in registers 610 (e.g., determined by sum and carry logic 620 in response to signal cnt_q and signal INC) is provided to registers 610 as signal cnt_next. Sum and carry logic 620 also provide a signal carry to overflow register 630 which may be used to provide overflow signal COUT as previously described in relation to FIG. 3. It will be appreciated that sum and carry logic 620 may be implemented using any appropriate logic to provide such features.

Counter 600 may be implemented to cause registers 610 to store a minimum value (e.g., zero) if an attempt is made to further increment the delay setting while a maximum delay setting is stored by registers 610. Counter 600 may also be implemented to cause registers 610 to store a maximum value (e.g., zero) if an attempt is made to further decrement the delay setting while a minimum delay setting is stored by registers 610.

In one embodiment, signal CE may be used to trigger one shot circuit 640. In this regard, each time signal CE transitions from a logic low value to a logic high value, registers 610 will increase or decrease by only one value in response to signal cnt_enable provided by one shot circuit 640, regardless of how many clock signal transitions are provided by signal CLK while signal CE remains set to a logic high value.

In another embodiment, one shot circuit 640 may be disabled. In this case, signal CE corresponds to signal cnt_enable which is provided to registers 610. As a result, registers 610 will increase or decrease by one delay setting for each cycle of signal CLK while signal CE remains at a logic high value. Accordingly, if a change in only a single delay setting is desired, then signal CE would be implemented with setup and hold timing attributes to remain at a logic high value for only one cycle of signal CLK.

Figure 6B:
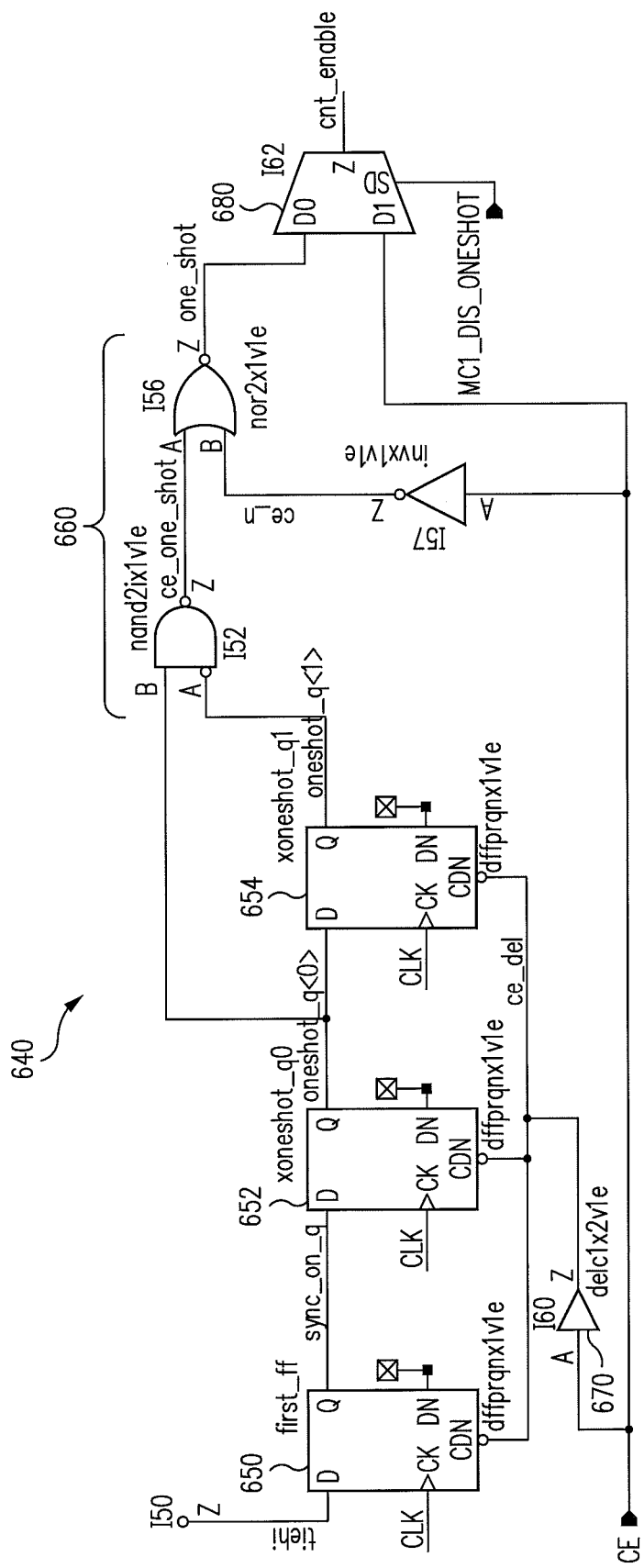
FIG. 6B illustrates a one shot circuit in accordance with an embodiment of the invention.

FIG. 6B illustrates one shot circuit 640 in accordance with an embodiment of the invention. As shown in FIG. 6B, one shot circuit 640 includes: flip flops 650, 652, and 654; logic 660; a delay element 670; and a multiplexer 680.

Signal CE is connected with delay element 670 which provides a delayed version of signal CE (labeled ce_del) to reset inputs (e.g., clear data inputs) of flip flops 650, 652, and 654. Accordingly, when signal CE is set to a logic low value, each of flip flops 650, 652, and 654 will be reset to logic low values following a delay determined by delay element 670. Signal CE is also connected with logic 660. When signal CE is set to a logic low value, logic 660 will set signal one_shot to a logic low value while flip flops 650, 652, and 654 are subsequently reset to logic low values in response to signal CE.

An input of flip flop 650 is connected with a reference voltage (labeled tiehi) which provides a fixed logic high value to flip flop 650 that propagates through flip flops 650, 652, and 654 in successive clock cycles of signal CLK. For example, following a reset of flip flops 650, 652, and 654 by signal CE, all of flip flops 650, 652, and 654 will provide logic low signals. Thereafter, flip flop 650 will be set to a logic high value in response to signal CLK causing reference voltage tiehi to be loaded into flip flop 650. This logic high value will propagate to flip flop 652 during the next cycle of signal CLK, and will further propagate to flip flop 654 during an additional cycle of signal CLK.

Accordingly, while signal CE is set at a logic high value, flip flops 652 and 654 will provide logic high and low values, respectively, for only one cycle of signal CLK. It will be appreciated that signal one_shot will provide a logic low value to multiplexer 680 unless: signal CE is set to a logic high value; flip flop 652 provides a logic high value; and flip flop 654 provides a logic low value. Therefore, signal one_shot will only provide a logic high value during a single cycle of signal CLK, even if signal CE continues to provide a logic high value.

As shown in FIG. 6B, signal one_shot may be selectively passed by multiplexer 680 in response to a disable signal (labeled MC1_DIS_ONESHOT) to provide signal cnt_enable previously described in FIG. 6A. Alternatively, signal CE may be passed by multiplexer 680 in response to the disable signal.

Figure 7:
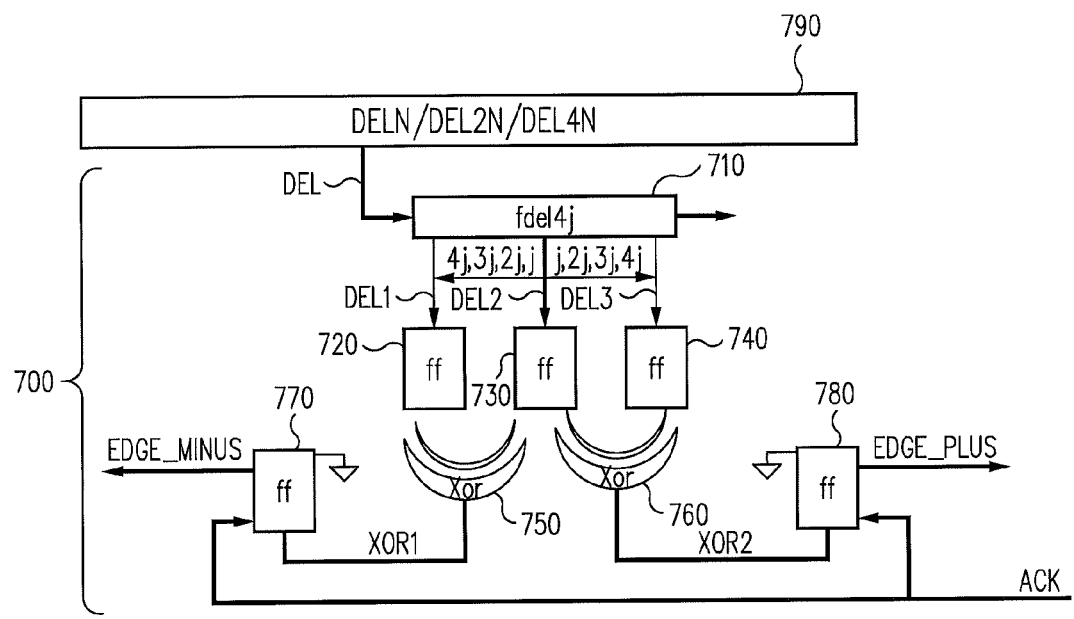
FIG. 7 illustrates a block diagram of an edge monitor in accordance with an embodiment of the invention.

FIG. 7 illustrates a block diagram of an edge monitor 700 in accordance with an embodiment of the invention. Edge monitor 700 may be provided as part of, or separate from, any of the delay cells set forth in the present disclosure.

Edge monitor 700 includes a delay block 710, logic 750 and 760, and a plurality of flip flops 720, 730, 740, 770, and 780. In the embodiment shown in FIG. 7, edge monitor 700 receives one of output signals DEL of FIG. 3 from delay elements 790 (labeled DELN/DEL2N/DEL4N) that may be provided by one or more of the delay cells set forth in the present disclosure.

Delay block 710 includes a plurality of delay elements (for example, 8*j delay elements, where j corresponds to any desired number of delay elements) which may be used to delay output signal DEL using different numbers of delay elements to provide delayed signals DEL1, DEL2, and DEL3. For example, delayed signal DEL2 may be delayed by 1j, 2j, 3j, 4j, or any other programmable number of delay elements relative to delayed signal DEL1. In addition, delayed signal DEL3 may be delayed by 1j, 2j, 3j, or 4j, or any other programmable number of delay elements relative to delayed signal DEL2. Accordingly, delayed signal DEL2 corresponds to output signal DEL at a time between that of delayed signal DEL1 and delayed signal DEL3. As a result, delayed signals DEL1, DEL2, and DEL3 can be used to provide the logic value of output signal DEL at three times between delayed signals DEL1 and DEL3.

Flip flops 720, 730, and 740 may be implemented to sample delayed signals DEL1, DEL2, and DEL3, respectively. Logic values stored by flip flops 720, 730, and 740 may be provided to logic 750 and 760. For example, in one embodiment logic 750 and 760 may be implemented as XOR logic as shown in FIG. 7 to provide signals XOR1 and XOR2 to flip flops 770 and 780, respectively. As such, in this embodiment, signal XOR1 will provide a logic high value when flip flops 720 and 730 are set to different logic values, and will provide a logic low value when flip flops 720 and 730 are set to the same logic values. Similarly, signal XOR2 will provide a logic high value when flip flops 730 and 740 are set to different logic values, and will provide a logic low value when flip flops 730 and 740 are set to the same logic values. The logic values of signals XOR1 and XOR2 are sampled by flip flops 770 and 780 to provide signals EDGE_MINUS and EDGE_PLUS, respectively.

Signals EDGE_MINUS and EDGE_PLUS can be used by PLD logic to determine the location of rising or falling edges of output signal DEL over the time between delayed signals DEL1 and DEL3. For example, if signals EDGE_MINUS and EDGE_PLUS both provide logic low values, this will indicate that flip flop 730 has sampled delayed signal DEL2 within the boundary of the valid window of output signal DEL, and the captured data in flip flop 730 should be valid data.

However, if the rising or falling edges of output signal DEL move in time (for example, due to voltage or temperature changes), the edges may approach the sampling point of flip flop 730. For example, if a rising or falling edge of output signal DEL occurs during a time window corresponding to the delay time between delayed signals DEL1 and DEL2, then signal EDGE_MINUS will provide a logic high value. Similarly, if a rising or falling edge of an edge of output signal DEL occurs during a time window corresponding to the delay time between delayed signals DEL2 and DEL3, then signal EDGE_PLUS will provide a logic high value. If output signal DEL exhibits jitter, then both of signals EDGE_PLUS and EDGE_MINUS may provide logic high values.

The logic values of signals EDGE_MINUS and EDGE_PLUS can be provided to appropriate circuitry, such PLD logic, which may be implemented to increment or decrement the programmed number of delay elements 790 in order to move output signal DEL forward or backward in time in order to maintain the sampling point of flip flop 730 well in the center of a data window of output signal DEL or away from rising or falling edges caused by jitter in output signal DEL. As shown in FIG. 7, flip flops 770 and 780 may be implemented to reset in response to a low-to-high transition of an acknowledgement signal ACK provided in response to signals EDGE_MINUS and EDGE_PLUS by appropriate circuitry, such as other PLD logic. In one embodiment, such other PLD logic may run at slower speeds than output signal DEL. Accordingly, by maintaining logic values in flip flops 770 and 780 until reset by acknowledgement signal ACK, the other PLD logic may process and respond to signals EDGE_MINUS and EDGE_PLUS before receiving new values for such signals.

Figure 8:
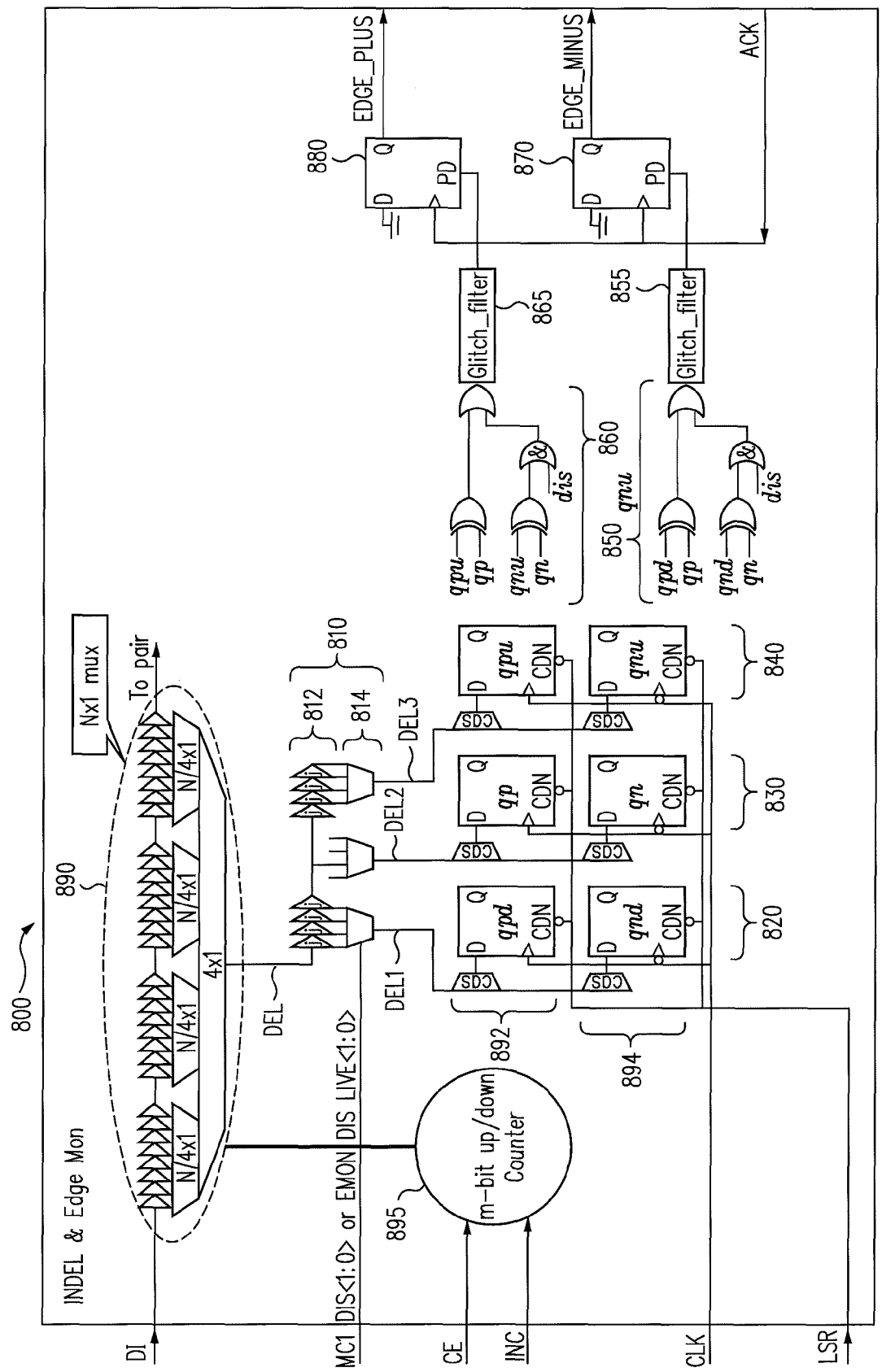
FIG. 8 illustrates a block diagram of a delay cell including an edge monitor in accordance with an embodiment of the invention.

FIG. 8 illustrates a block diagram of a delay cell 800 including an edge monitor in accordance with an embodiment of the invention. In this regard, delay cell 800 may include various components corresponding to those of other delay cells and edge monitor 700 described herein. Accordingly, the various components of delay cell 800 may operate in a manner similar to that of other corresponding components described herein.

As shown in FIG. 8, delay cell 800 includes a plurality of delay elements 890 and a counter 895 that may be implemented to correspond, for example, to delay elements 210 and counter 230, respectively of FIG. 2. As shown in FIG. 8, delay cell 800 may receive an input signal DI, and delay adjustment signals CE and INC, a clock signal CLK, and other signals described herein.

Delay cell 800 includes a plurality of delay elements 812 and multiplexers 814 that may be used to provide a plurality of delayed signals DEL1, DEL2, and DEL3 to a plurality of flip flops 820, 830, and 840, respectively. In this regard, delay elements 812 and multiplexers 814 may be used to implement delay block 710 of FIG. 7, and flip flops 820, 830, and 840 may be used to implement flip flops 720, 730, and 740, respectively, of FIG. 7.

Delay cell 800 may receive signal MC1_DIS or signal EMON_DIS_LIVE to adjust the number of delay elements used to delay delayed signals DEL1, DEL2, and DEL3 relative to each other. In this regard, signal MC1_DIS or signal EMON_DIS_LIVE may be used to permit user control of the monitor distance on the fly in response to the size of a valid data window. In this regard, FIG. 8 shows the choice of 4 monitor distances provided by delay elements 812. However, any other desired monitor distance (for example, 2, 8, or other distances) may be implemented using different numbers of delay elements 812.

Flip flops 820, 830, and 840 may be implemented to sample delayed signals DEL1, DEL2, and DEL3 in response to clock signal CLK. In particular, flip flops in a top row 892 may operate to sample signals on a rising edge of clock signal CLK, and flip flops in a bottom row 894 may operate to sample signals on a falling edge of clock signal CLK. Optionally, flip flops in both top row 892 and bottom row 894, or only flip flops in top row 892 may be used.

Delay cell 800 also includes logic 850 and 860 that may be used to implement logic 750 and 760, respectively, of FIG. 7, and flip flops 870 and 880 that may be used to implement flip flops 770 and 780, respectively, of FIG. 7. Delay cell 800 further includes glitch filters 855 and 865 between logic 850/860 and flip flops 870/880. Glitch filters 855 and 865 may be implemented by appropriate circuitry to filter out unwanted logic changes attributable to, for example, routing differences from flip flops 820, 830, and 840 to logic 850 and 860. Delay cell 800 may also receive signal LSR which is used to clear flip flops 820, 830, 840, 870, and 880 prior to the start or restart of operation.

Figure 9:
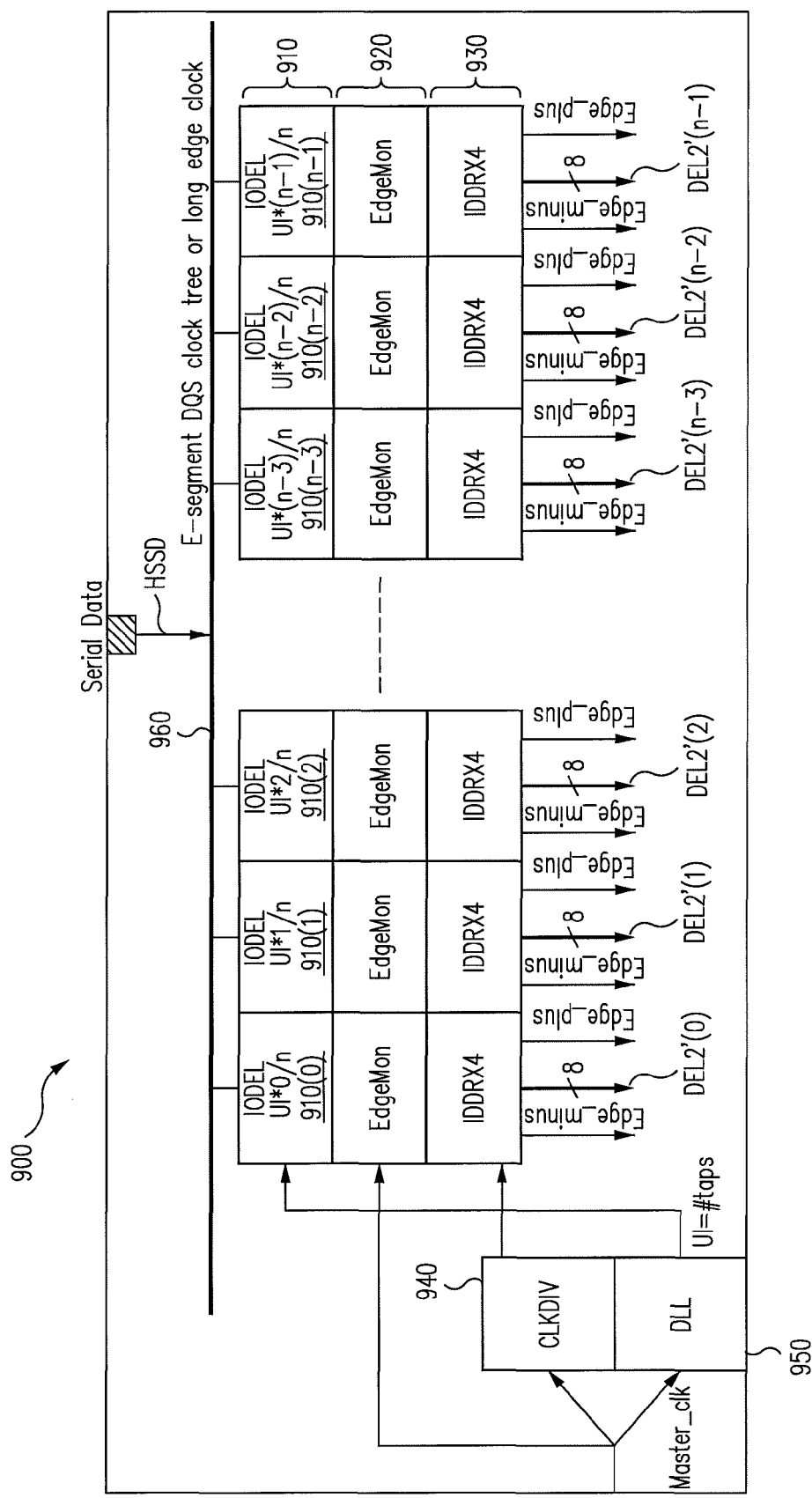
FIG. 9 illustrates a block diagram of system configured to perform high speed serial data recovery in accordance with an embodiment of the invention.

FIG. 9 illustrates a block diagram of a system 900 configured to perform high speed serial data recovery in accordance with an embodiment of the invention. System 900 may be implemented, for example, as part of I/O blocks 102 of PLD 100 illustrated in FIG. 1 to recover data from a high speed serial data signal (for example, operating at greater than approximately 500 Mb/sec) received by PLD 100. System 900 may be used to sample values of a high speed serial data signal at a plurality of times during a single bit period to permit PLD logic to select one of the sampling points to be used to determine data values provided by the high speed serial data signal.

System 900 includes a plurality of delay cells 910, a plurality of edge monitors 920, a plurality of multiplexer/demultiplexer (mux/demux) blocks 930, a clock divider 940, and a delay locked loop (DLL) 950. Delay cells 910 may be implemented using any of the delay cells set forth in the present disclosure. As shown in FIG. 9, delay cells 910 receive a high speed serial data signal (labeled HSSD) from a clock network 960, such as an ultra low skew clock network. Advantageously, the use of an ultra low skew clock network can facilitate phase accuracy among different sampling points in comparison with other signal distribution approaches (e.g., generic FPGA routing) which may skew the bit period of high speed signals and consequently limit data recovery performance.

Means such as delay cells 910 and/or other appropriate structures disclosed herein (e.g., delay cells 200, 300, 400, 800, and/or 1310 and/or delay block 710) may be used for delaying a serial data signal (e.g., signal HSSD) to provide a first plurality of output signals that are delayed relative to the serial data signal by a first plurality of delay times distributed over a first portion of a bit period of the serial data signal. Similarly, means such as delay cells 910 and/or other appropriate structures disclosed herein (e.g., delay cells 200, 300, 400, 800, and/or 1310 and/or delay block 710) may be used for delaying the serial data signal to provide a second plurality of output signals that are delayed relative to the serial data signal by a second plurality of delay times distributed over a second portion of the bit period of the serial data signal. In addition, means such as edge monitors 920 and/or other structures disclosed herein (e.g., edge monitor 700) may be used for detecting whether edge transitions of the first and second plurality of output signals have occurred during a plurality of time windows. Means such as logic blocks 104 described herein may be used for selecting one of the output signals in response to such detecting means. Also, means such as logic blocks 104, delay adjustment signal CE, and/or delay adjustment signal INC may be used for adjusting a delay setting of at least one of the delaying means in response to the detecting means.

Edge monitors 920, clock divider 940, and DLL 950 receive a master clock signal (labeled Master_clk) which may operate approximately at the speed of the high speed serial data signal received by system 900. For example, in one embodiment, signal Master_clk may be implemented by clock signal CLK previously described herein.

Delay cells 910 may be programmed to delay signal HSSD by various amounts in order to permit edge monitors 920 to sample signal HSSD at a plurality of points during each bit rate period of signal HSSD. In the embodiment shown in FIG. 9, system 900 includes n delay cells 910 (labeled 910(0) through 910(n–1), each of which includes a total number of delay elements identified by UI. Accordingly, as illustrated, delay cells 910 may be programmed with different fractions of their total available delay elements that increase from 0/n to (n–1)/n for delay cells 910(0) to 910(n–1). For example, in one embodiment where n equals 8, each of delay cells 910 may be programmed to delay signal HSSD in a manner to permit edge monitors 920 to sample signal HSSD at different times spaced approximately ⅛ bit period apart.

The particular number of delay elements programmed into each of delay cells 910 may be provided by DLL block 950 or a ring oscillator circuit. Further details regarding the programming of delay elements using DLLs and ring oscillator circuits may be found in U.S. Pat. No. 7,009,433 and U.S. patent application Ser. No. 11/281,651, each of which are hereby incorporated by reference.

The delayed versions of signal HSSD provided by delay cells 910 are passed to edge monitors 920 which may be implemented, for example, using any of the edge monitors set forth in the present disclosure. Each of edge monitors 920 may be implemented to provide delayed signals DEL1, DEL2, and DEL3, and signals EDGE_MINUS and EDGE_PLUS as previously described. In particular, edge monitors 920 may sample logic values of delayed signals DEL1, DEL2, and DEL3 in response to signal Master_clk.

In order to facilitate low speed processing of delayed signals DEL2 (e.g., by PLD logic), mux/demux blocks 930 may be implemented to convert each of delayed signals DEL2 into a plurality of delayed signals DEL2' (for example, eight delayed signals DEL2' for each of delayed signals DEL2) under the control of a divided clock signal provided by clock divider 940. Further details regarding the implementation of appropriate circuitry that may be used for mux/demux blocks 930 may be found in U.S. Pat. No. 7,109,756 which is hereby incorporated by reference.

Delayed signals DEL2' and signals EDGE_MINUS and EDGE_PLUS may be processed by PLD logic to determine the clock edges of signal HSSD. In this regard, signal HSSD may cause different edge monitors 920 to provide different values for signals EDGE_MINUS and EDGE_PLUS. In one embodiment, PLD logic may be implemented to select data provided by particular delayed signals DEL2' received from mux/demux blocks 930 with signals EDGE_MINUS and EDGE_PLUS having values that indicate the current sampling point of their associated delayed signals DEL2' is located away from transition edges of signal HSSD. In another embodiment, PLD logic may be implemented to adjust delay settings of one or more of delay cells 910 in response to signals EDGE_MINUS and EDGE_PLUS.

In one embodiment, a high speed clock signal may be recovered from signal HSSD by creating a low speed version signal HSSD. In this regard, delayed signals DEL2' may be fed back into a phase-locked loop (PLL) circuit (not shown) if desired. A PLL may also be used to increase the frequency of master clock signal Master_clk higher than the serial data bit rate of signal HSSD. If master clock signal Master_clk is slightly higher than the serial data bit rate, PLD logic may be implemented to periodically discard sampled data from delayed signals DEL2' and insert a pulse for the recovered clock. If master clock signal Master_clk is slightly lower than the serial data bit rate, PLD logic may be implemented to periodically take two sets of data in the same bit period to prevent data loss and insert a pulse for the recovered clock.

In another embodiment, system 900 may be used for multiple clock phase sampling instead of multiple data delay sampling. For example, 4 clocks 45 degrees from each other, plus inversion, may be provided to delay blocks 910 and used to form 8 difference phases.

Figure 10:
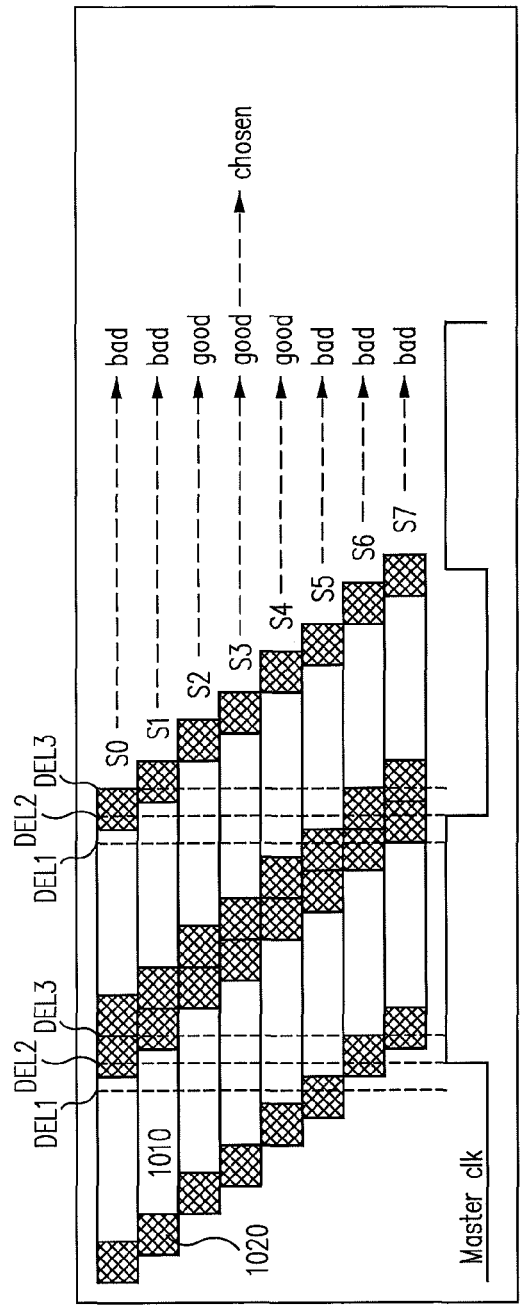
FIGS. 10-12 illustrate timing diagrams showing signals sampled using the system of FIG. 9 in accordance with embodiments of the invention.

FIG. 10 illustrates a timing diagram showing signals sampled using system 900 of FIG. 9 implemented with eight delay cells 910. Signals S0 through S7 are delayed versions of signal HSSD provided by delay cells 910(0) through 910(7). Each of signals S0 through S7 includes unshaded portions 1010 corresponding to valid data windows (e.g., where the signal exhibits a definite logic value such as between transition edges) and unshaded portions 1020 corresponding to invalid data windows (e.g., where the signal exhibits an indefinite logic value such as at or near transition edges).

Master clock signal Master_clk previously described in FIG. 9 is also illustrated relative to signals S0 through S7. Each of edge monitors 920 may sample delayed signals DEL1, DEL2, and DEL3 previously described herein. In this regard, FIG. 10 further identifies the time at which each of signals S0 through S7 are sampled by edge monitors 920 relative to master clock signal Master_clk to provide delayed signals DEL1, DEL2, and DEL3.

As shown in FIG. 10, this sampling may occur during unshaded portions 1010 or shaded portions 1020 of signals S0 through S7. When all three samples for a given one of signals S0 through S7 fall within an unshaded portion 1010, then signals EDGE_MINUS and EDGE_PLUS will both be set to logic low values and any of signals S0 through S7 exhibiting this characteristic will be deemed a "good" signal. Conversely, a signal sampled in shaded portions 1020 will be deemed a "bad" signal. PLD logic may choose to use sampled data values of good signals in recovering the data values of serial data. For example, in this case, signals S2, S3, and S4 may be deemed good signals.

Figure 11:
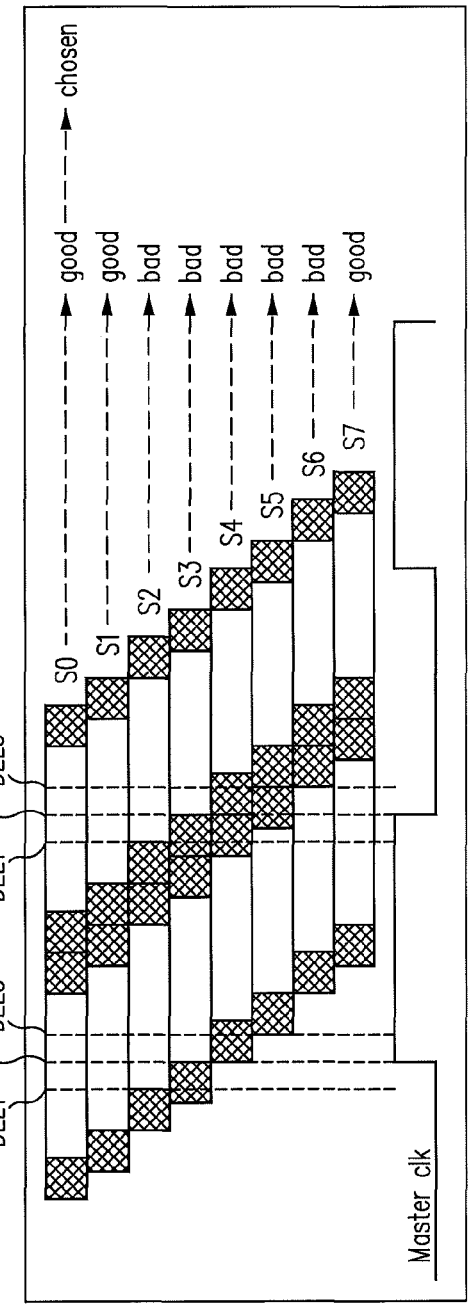

FIG. 11 illustrates another timing diagram showing signals sampled using system 900 of FIG. 9 implemented with eight delay cells 910. In this case, the timing of signals S0 through S7 has shifted relative to that shown in previous FIG. 10. Such drift may occur, for example, if the frequency of master clock signal Master_clk differs from that of the serial data. As a result, PLD logic may choose to use sampled data values of different signals in order to recover the data values of serial data. For example, in this case, signals S0, S1, and S7 may be deemed good signals.

Figure 12:
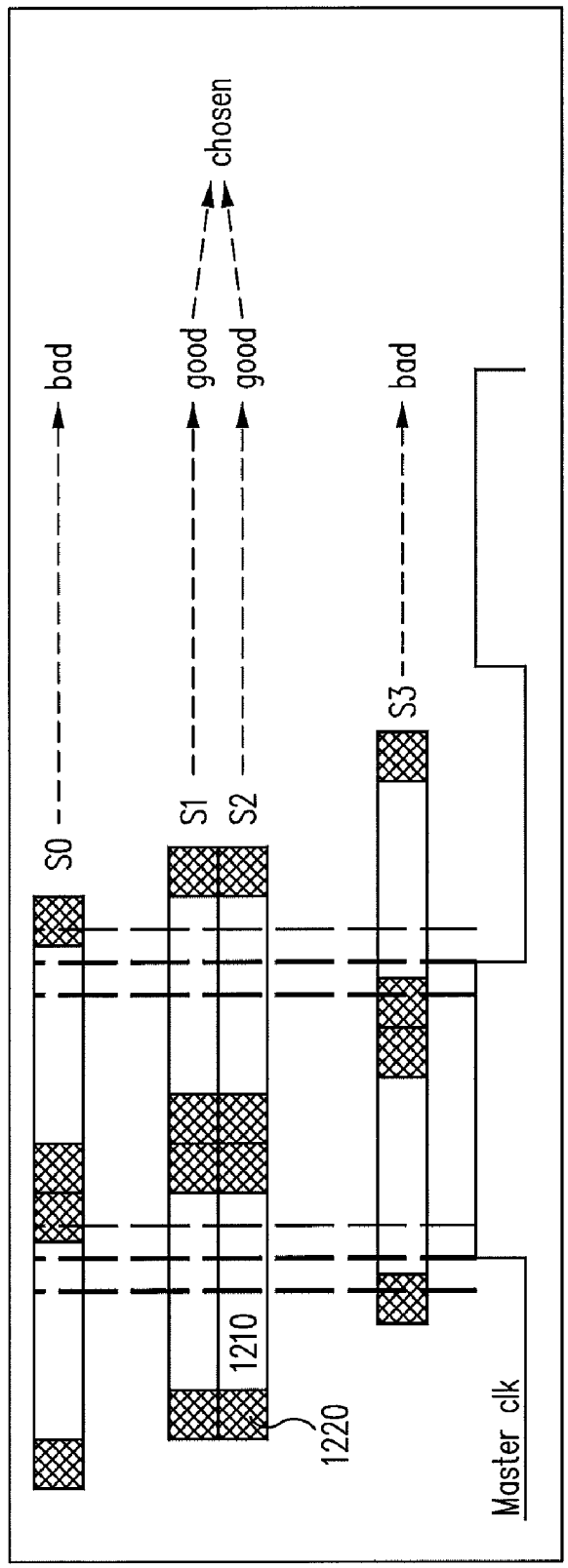

FIG. 12 illustrates a timing diagram showing signals sampled using system 900 of FIG. 9 implemented with four delay cells 910. Accordingly, only four delayed signals S0 through S3 are illustrated relative to clock signal CLK. In the particular embodiment shown in FIG. 12, the delay settings of delay cells 910 may be selected such that delayed signals S0 through S3 are not distributed over one bit period of the serial data. Rather, two signals (e.g., signals S0 and S3) are delayed such that their sampling points are close to the transition edges of the serial data, and two other signals (e.g., signals S1 and S2) are delayed such that their sampling points are in the center of the serial data window. For example, in one embodiment, the particular delay cells 910 associated with delayed signals S1 and S2 may be programmed with the same delay settings As shown in FIG. 12, when signals S0 through S3 are sampled, unshaded portions 1210 of signals S1 and S2 are sampled, and shaded portions 1220 of signals S0 and S3 are sampled. Accordingly, signals S2 and S3 may be selected as good signals.

In one embodiment, PLD logic may refrain from simultaneously adjusting the delay settings of particular delay cells 910 associated with signals S2 and S3 in order to maintain at least one of signals S2 and S3 within a valid data window of the serial data. In another embodiment, a larger number of delay cells 910 (for example, eight delay cells) may be initially used to lock on to the serial data, and a smaller number of delay cells 910 (for example, four delay cells) may be used thereafter to conserve power.

Figure 13:
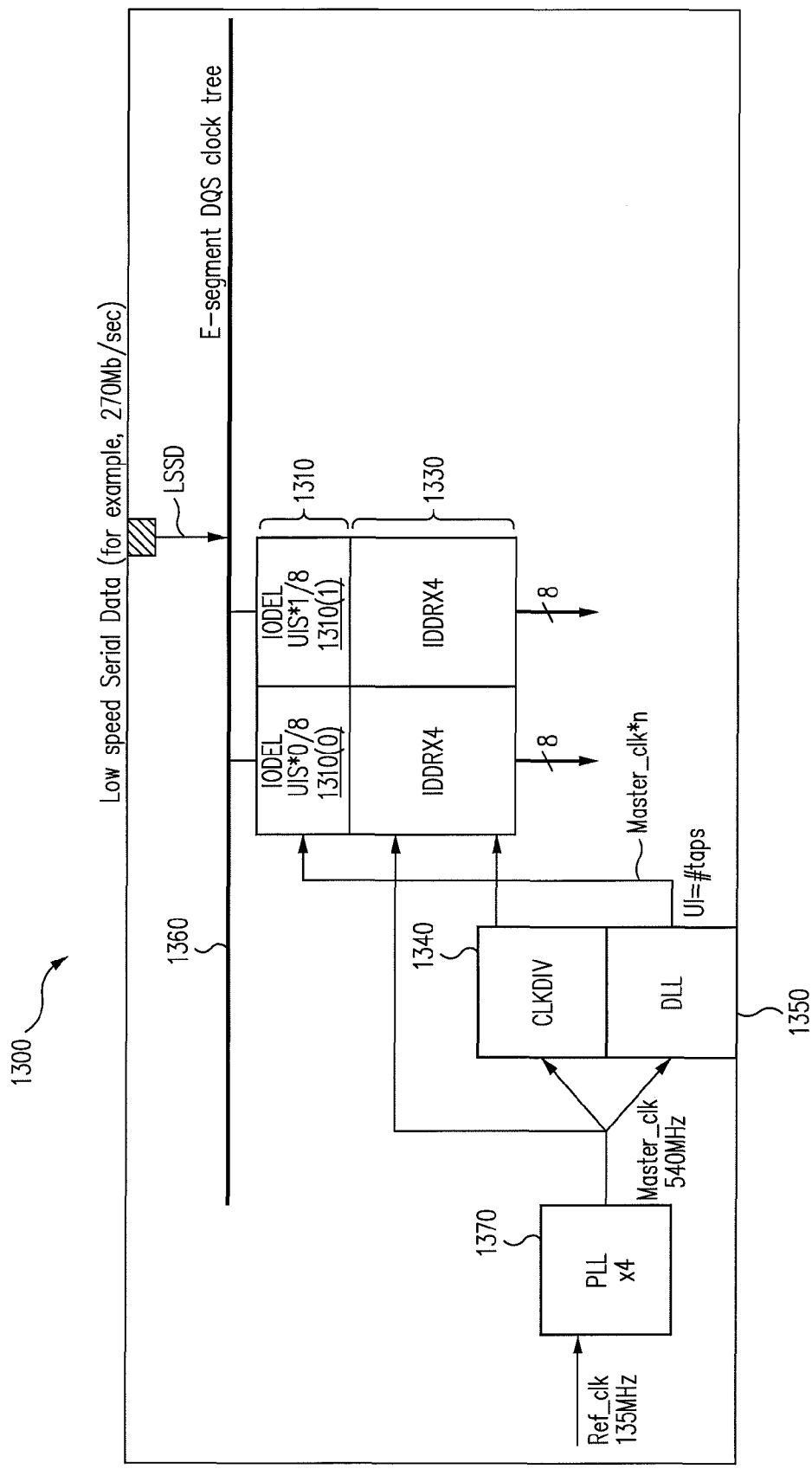
FIG. 13 illustrates a block diagram of a system configured to perform low speed serial data recovery in accordance with an embodiment of the invention.

FIG. 13 illustrates a block diagram of a system 1300 configured to perform low speed serial data recovery in accordance with an embodiment of the invention. System 1300 may be implemented, for example, as part of I/O blocks 102 of PLD 100 illustrated in FIG. 1 to recover a data from a low speed serial data signal (for example, operating at less than approximately 500 Mb/sec) received by PLD 100.

System 1300 includes a plurality of delay cells 1310, a plurality of multiplexer/demultiplexer (mux/demux) blocks 1330, a clock divider 1340, a delay locked loop (DLL) 1350, and a PLL 1370. Mux/demux blocks 1330, clock divider 1340, and DLL 1350 receive a master clock signal (labeled Master_clk) which may operate at a speed higher than that of the low speed serial data signal received by system 1300 (for example, operating at a speed of approximately 540 Mb/sec). As shown, master clock signal Master_clk may be provided by PLL 1370 in response to a lower speed reference clock (labeled Ref_clk) operating, for example, at 135 MHz.

Delay cells 1310 may be implemented using any of the delay cells set forth in the present disclosure. Delay cells 1310 may receive a low speed serial data signal (labeled LSSD) from a clock network 1360, such as an ultra low skew clock network.

Delay cells 1310 may be programmed to delay signal LSSD received through clock network 1360 by differing amounts in order to sample signal LSSD at different times during the bit rate period of the serial data. In this regard, delay cells 1310 may include flip flops (for example, flip flops 820, 830, and 840 of FIG. 8) to sample delayed versions of signal LSSD at rising and falling edges of a multiplied master clock signal (labeled Master_clk*n) provided by DLL 1350.

Because low speed data will exhibit a longer period than that of high speed data, delay cells 1310 may be implemented with insufficient delay elements to permit sampling over an entire bit period of signal LSSD. For example, in one embodiment, each of delay cells 1310 may be implemented with a maximum delay time of approximately 1.8 ns.

Figure 14:
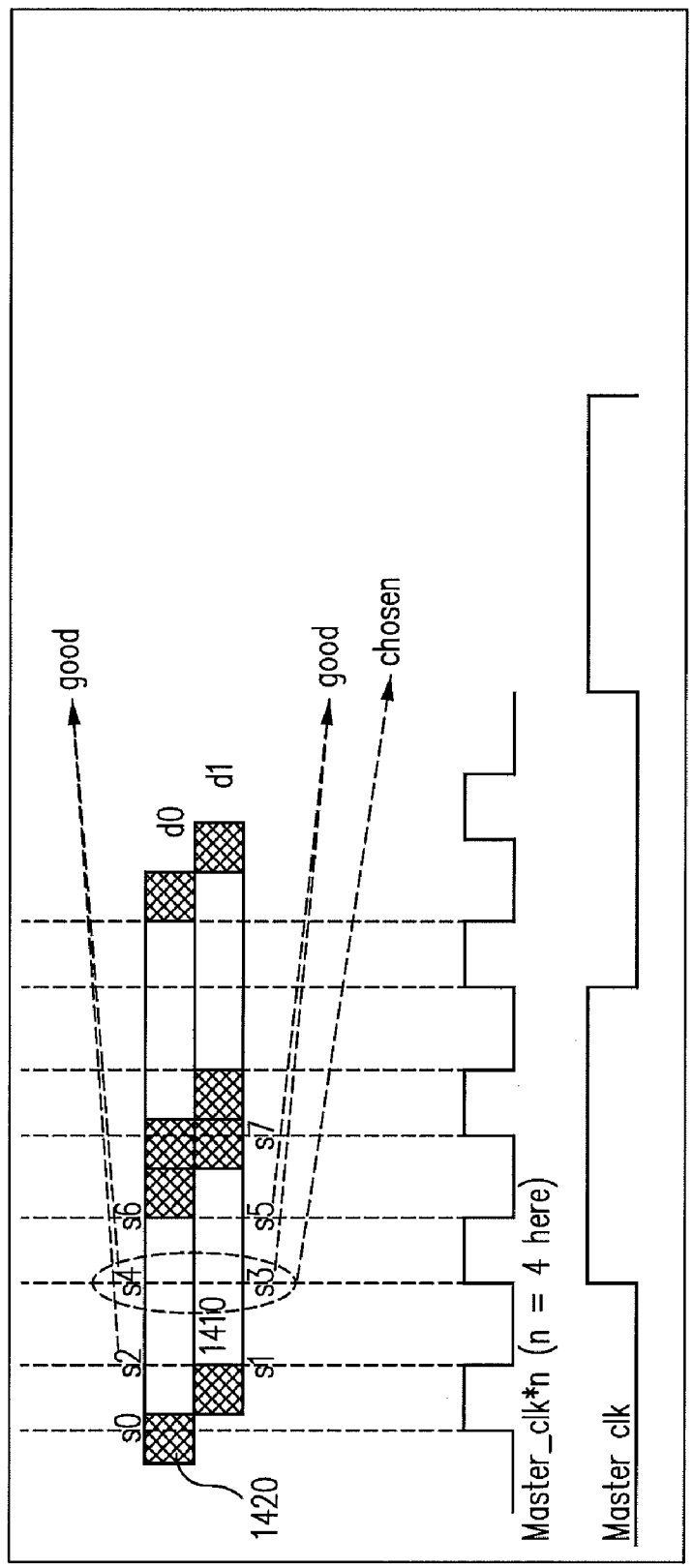
FIG. 14 illustrates a timing diagram showing signals sampled using the system of FIG. 13 in accordance with an embodiment of the invention.

FIG. 14 illustrates a timing diagram showing signals sampled using system 1300 of FIG. 13 implemented with two delay cells 1310 used to sample signal LSSD four times per bit period. Signals d0 and d1 are delayed versions of signal LSSD provided by delay cells 1310(0) and 1310(1). Each of signals d0 and d1 includes unshaded portions 1410 corresponding to valid data windows (e.g., where the signal exhibits a definite logic value such as between transition edges) and unshaded portions 1420 corresponding to invalid data windows (e.g., where the signal exhibits an indefinite logic value such as at or near transition edges). Master clock signal master_clk and multiplied master clock signal Master_clk*n previously described in FIG. 13 are also illustrated relative to signals d0 and d1.

Delay cells 1310 may sample logic values of delayed signals at rising and falling edges of multiplied master clock signal Master_clk*n. In this regard, FIG. 14 further identifies the time at which each of signals d0 and d1 are sampled relative to master clock signal master_clk.

As shown in FIG. 14, this sampling may occur during unshaded portions 1410 or shaded portions 1420 of signals d0 and d1. PLD logic may be implemented to process the various samples (received through mux/demux blocks 1330) to select which sampled data values to use, such as those occurring within unshaded portions 1410 of both signals d0 and d1. For example, in this case, samples s4 and s3 of signals d0 and d1, respectively, occur during unshaded portions 1410 and may be deemed good samples.

PLD logic may be configured to adjust programmed delay settings of delay cells 910 and 1310 in response to the signals and logic values provided by systems 900 and 1300. As a result, systems 900 and 1300 may be used to lock onto signals HSSD and LSSD, respectively, within several bit periods. Advantageously, sampled logic values of signals HSSD and LSSD may all be provided in a single clock domain. As a result, the samples may be more conveniently processed by PLD logic over implementations using multiple clock phases.

Embodiments described above illustrate but do not limit the invention. It should also be understood that numerous modifications and variations are possible in accordance with the principles of the present invention. Accordingly, the scope of the invention is defined only by the following claims.

We claim:

1. A delay cell for a programmable logic device comprising:
    a plurality of delay elements coupled in series, each delay element adapted to delay a signal a known time;
    a multiplexer having inputs coupled to outputs of the delay elements in the series;
    a counter coupled to selection inputs of the multiplexer to select an output of a delay element corresponding to a desired delay time for the delay cell, the counter adapted to provide a count to the selection inputs based at least in part on a number of transitions of a clock signal received while the counter is enabled to count; and
    a one-shot circuit coupled to the counter and, when enabled, adapted to control changes in the count of the counter regardless of the clock signal,
    wherein the one-shot circuit is adapted to change the count of the counter by a single count.

2. The delay cell of claim 1, wherein the delay elements comprise inverters.

3. The delay cell of claim 1, wherein the delay elements are voltage controlled delay elements.

4. The delay cell of claim 1, wherein the delay elements are current controlled delay elements.

5. The delay cell of claim 1, wherein counter is an m-bit register.

* * * * *